(12) United States Patent
Wu et al.

(10) Patent No.: US 9,722,110 B2
(45) Date of Patent: Aug. 1, 2017

(54) PLASMONIC GRAPHENE AND METHOD OF MAKING THE SAME

(71) Applicant: University of Kansas, Lawrence, KS (US)

(72) Inventors: Judy Wu, Lawrence, KS (US); Guowei Xu, Lawrence, KS (US); Jianwei Liu, Manhattan, KS (US)

(73) Assignee: UNIVERSITY OF KANSAS, Lawrence, KS (US)

(*) Notice: Subject to any disclaimer, the term of this patent is extended or adjusted under 35 U.S.C. 154(b) by 939 days.

(21) Appl. No.: 13/657,161

(22) Filed: Oct. 22, 2012

(65) Prior Publication Data

US 2015/0122320 A1 May 7, 2015

Related U.S. Application Data

(60) Provisional application No. 61/549,464, filed on Oct. 20, 2011.

(51) Int. Cl.
| | |
|---|---|
| *B05D 3/00* | (2006.01) |
| *H01L 31/028* | (2006.01) |
| *H01L 21/02* | (2006.01) |
| *H01L 29/06* | (2006.01) |
| *H01L 29/16* | (2006.01) |
| *H01L 31/0224* | (2006.01) |
| *H01L 31/103* | (2006.01) |
| *H01L 49/00* | (2006.01) |
| *B82Y 40/00* | (2011.01) |
| *B82Y 30/00* | (2011.01) |

(Continued)

(52) U.S. Cl.
CPC ............ *H01L 31/028* (2013.01); *B05D 3/007* (2013.01); *H01L 21/02376* (2013.01); *H01L 21/02554* (2013.01); *H01L 21/02603* (2013.01); *H01L 21/02628* (2013.01); *H01L 21/02658* (2013.01); *H01L 29/0676* (2013.01); *H01L 29/1606* (2013.01); *H01L 31/022466* (2013.01); *H01L 31/103* (2013.01); *H01L 49/006* (2013.01); *B05D 2201/06* (2013.01); *B82Y 30/00* (2013.01); *B82Y 40/00* (2013.01); *H01L 21/02425* (2013.01); *H01L 21/02527* (2013.01); *H01L 33/0087* (2013.01); *H01L 33/18* (2013.01); *Y10T 428/30* (2015.01)

(58) Field of Classification Search
CPC ...................................... B05D 3/007
See application file for complete search history.

(56) References Cited

U.S. PATENT DOCUMENTS

| | | | |
|---|---|---|---|
| 6,232,264 B1 * | 5/2001 | Lukehart | B01J 35/0013 502/150 |
| 7,976,950 B2 | 7/2011 | Okai et al. | |
| 2010/0046060 A1 | 2/2010 | Lee et al. | |

(Continued)

OTHER PUBLICATIONS

Zhou et al., JACS, 2010, 132, pp. 944-946.*

(Continued)

*Primary Examiner* — James M Mellott
(74) *Attorney, Agent, or Firm* — Stinson Leonard Street LLP

(57) ABSTRACT

Plasmonic graphene is fabricated using thermally assisted self-assembly of plasmonic nanostructure on graphene. Silver nanostructures were deposited on graphene as an example.

19 Claims, 6 Drawing Sheets

(51) Int. Cl.
  *H01L 33/00*    (2010.01)
  *H01L 33/18*    (2010.01)

(56) References Cited

U.S. PATENT DOCUMENTS

2011/0030772 A1   2/2011   Veerasamy
2011/0186119 A1   8/2011   Atwater et al.

OTHER PUBLICATIONS

Luo et al., Nano Lett, 2010, 10, 777-781., published on the web Jan. 29, 2010.*
Borysiak, Graphene Synthesis by CVD on Copper Substrates, The 2009 NNIN REU Research Accomplishments, pp. 70-71, available on the web Dec. 20, 2009.*
Reina et al., J. Phys. Chem. C, vol. 112, No. 46, 2008, pp. 17741-17744.*
Hulteen et al., J. Phys. Chem. B, 1997, 101, 7727-7731.*
Bechelany et al., Crystal Growth & Design, vol. 10, No. 2, 2010, pp. 587-596.*
Bonaccorso et al., *Graphene photonics and optoelectronics*, Nature Photonics 4 611-622 (2010).
Echtermeyer et al., *Strong plasmonic enhancement of photovoltage in graphene*, Nature Comm 2:458 (2011).
Liu et al., *Doped graphene nanohole arrays for flexible transparent conductors*, Applied Physics Letters 99 023111-023111-3 (2011).
Xu et al., *Plasmonic Graphene Transparent Conductors*, Adv. Mater. 24 71-76 (2012).

\* cited by examiner

PLASMONIC GRAPHENE AND METHOD OF MAKING THE SAME

CROSS-REFERENCE TO RELATED APPLICATIONS

This application is based on and claims priority to U.S. Provisional Application Ser. No. 61/549,464, filed on Oct. 20, 2011, which is incorporated herein by reference in its entirety.

STATEMENT REGARDING FEDERALLY SPONSORED RESEARCH OR DEVELOPMENT

The present invention was sponsored by the US Army Research Office No. ARO-W911NF-09-1-0295 and W911NF-12-1-0412, and National Science Foundation Contracts Nos. NSF-DMR-0803149, 1105986, and EPSCoR-0903806, and the government may have certain rights in the invention.

BACKGROUND OF THE INVENTION

Graphene, a single layer of carbon atoms arranged in a hexagonal lattice (see Wassei et al. (2010) and Bonaccorso et al. (2010)), has unique properties of high carrier mobility, high optical transmittance, chemical inertness and flexibility, making it attractive for optoelectronic applications (see Bonaccorso et al. (2010)). In particular, graphene may provide a promising alternative to indium tin oxide ("ITO") as transparent conductors ("TC") (see Bonaccorso et al. (2010)). Currently ITO is widely employed as a transparent conductive electrode with a sheet resistance of as low as 10-30 Ω/square and transparency up to 90% at 550 nm wavelength (see Wassei et al. (2010)). However, long-term use of ITO has severe limitations. It is scarce and consequently becomes prohibitively expensive as the massive demand for photovoltaic devices increases. In addition, ITO is brittle and has much reduced transparency at longer wavelengths (λ), which are unfavorable for high-efficiency, broad-band photovoltaic devices on flexible substrates. Graphene has several unique advantages as the TC for photovoltaic due to its high electrical conductivity, remarkable optical transparency in white light, and favorable work function of about 4.42 eV (see Czerw et al. (2002) and Stankovich et al. (2006)). In fact, each sheet of graphene absorbs only about 2.3% of the incident white light due to its unique gapless electronic structure. In particular, the recent work of large-area growth of graphene using chemical vapor deposition ("CVD") on metal foils has made an important step toward application of graphene for flexible TCs (see Wassei et al. (2010) and Bae et al. (2010)). Further development of graphene-based TC is therefore important to high-performance and low-cost photovoltaic and other optoelectronic devices.

In thin film solar cells, plasmonic structures that promote the collective oscillation of electrons at a resonance frequency at the interface of metal and dielectric material, have been demonstrated effective in enhancing light scattering and hence light absorption (see Atwater et al. (2010)). Progress has been made recently in application of plasmonics in thin film solar cells (see Atwater et al. (2010), especially in Si-based (see Beck et al. (2010)) and organic solar cells (see Kim et al. (2008)). One approach to integrate plasmonics into solar cells is through addition of metal nanoparticles ("NPs"), on which the resonance frequency of the localized surface plasmons is primarily determined by the charge carrier density of metal and can be further tuned by the size, shape, and surrounding dielectric medium of metal NPs (see Stockman (2011)). A variety of metals have been investigated and silver seems to be one of the few favorable ones for visible applications (others include but are not limited to Cu, Au, and Al) due to its plasmonic frequency in the visible range and low Ohmic losses. Enhanced light trapping has yielded increased photocurrents in solar cells with plasmonic structures implemented (see Beck et al. (2009) and Pillai et al. (2007)). Most recently, graphene with plasmonic nanostructures was reported with strong enhancement of efficiency of graphene-based photodetector (see Echtermeyer et al. (2011)). Development of plasmonic graphene is hence of primary importance to its application as advanced TCs for optoelectronic devices.

BRIEF SUMMARY OF THE INVENTION

The present invention is directed to a method for forming plasmonic graphene and the resulting plasmonic graphene prepared using the method. The method includes the steps of forming a graphene sheet on a support substrate; depositing a film of a plasmonic material on the graphene sheet; and heating the graphene sheet with the plasmonic material to form plasmonic graphene. The plasmonic graphene comprises graphene having a plurality of plasmonic nanostructures thereon. Broadly speaking, the method involves thermal-assisted self assembly of the plasmonic material to provide nanostructures of high density of controllable dimensions on the graphene sheet. The density of the plasmonic nanostructures may be controlled using this self-assembly method.

In one aspect, the support substrate for the graphene sheet comprises a silicon dioxide or glass substrate. In still another aspect, the plasmonic material is selected from the group consisting of silver, gold, copper, or mixtures thereof. In yet another aspect, the graphene sheet is prepared by growing a graphene sheet on a copper substrate using chemical vapor deposition; spin-coating a polymer layer, such as a polymethylmethacrylate ("PMMA") layer, onto the graphene sheet; removing the copper substrate by contacting the copper substrate with an iron chloride solution; transferring the graphene to a support substrate, such as a glass or silicon dioxide support substrate; and removing the polymer layer. In still another aspect, the graphene sheet comprises 1 to 3 layers of graphene.

In yet another aspect, the graphene film is cleaned prior to depositing the plasmonic material so that there is a clean interface between the graphene and plasmonic material. For example, the graphene may be annealed at elevated temperatures using argon/hydrogen for several minutes.

In another aspect, the plasmonic graphene made in accordance with the present invention has an electrical conductivity that is higher than the graphene sheet without the plasmonic nanostructures thereon.

In another aspect, the plasmonic graphene exhibits a higher G peak and 2D peak compared to a graphene sheet without the plasmonic nanostructures thereon.

In yet another aspect, the plasmonic graphene exhibits a red-shifted plasmonic resonance frequency compared to the plasmonic material on bare glass.

In still another aspect, the present invention is directed to photovoltaic devices having one or more electrodes comprised of the plasmonic graphene prepared according to the methods described herein.

In another aspect, the present invention is directed to photodetectors and sensors (for biomolecules, chemicals and gases, for example) incorporating the plasmonic graphene of the present invention. Besides solid insulating gating materials either on top or at the bottom of the graphene (back gate or top gate), electrolytes and/or ionic liquids may be employed as the gating dielectric. The generation of the plasma resonance by the incident light in the evanescent field form in proximity around the plasmonic nanoparticles can facilitate high efficiency energy transfer from nanoparticles to the molecules attached to the plasmonic graphene, either on graphene or on plasmonic nanoparticles, resulting in molecule deformation or motion and therefore localized gate field change. Consequently, this gating field change induces the conductivity change in graphene, providing approaches for photo/bio/chem/gas detection.

In still another aspect, the present invention is directed to field-effect transistors ("FETs") incorporating the plasmonic graphene of the present invention. Preferably, electrolytes and/or ionic liquids are employed as the gating dielectrics in electrical double-layer transistor ("EDLT") to achieve high gating efficiency. Nevertheless, other gating schemes can be employed for the plasmonic graphene-based detectors and sensors since the operation of these devices are most probably in the range of small gating electric fields near zero as demonstrated in the examples provided in this application.

In an exemplary embodiment, plasmonic graphene was fabricated by depositing silver films (thickness in the range of about 1 nm to 20 nm) onto CVD grown graphene using electron-beam evaporation, which was followed with a thermal treatment in a reducing gas (for example, $H_2$/Ar gas) to form silver nanostructures via thermal-assisted self-assembly. Characterization of the localized surface plasmonic effect was carried out using Raman spectroscopy in combination with visible optical spectroscopy using integrating sphere. Simulation using Finite-Difference Time-Domain ("FDTD") method was employed to understand the effect of graphene thickness on the plasmonic effect. Besides the surface plasmonic enhanced light scattering in solar spectrum, improved electrical conductance was also confirmed on the plasmonic graphene, making it promising for applications of the advanced TCs for thin film solar cells.

Additional aspects of the invention, together with the advantages and novel features appurtenant thereto, will be set forth in part in the description which follows, and in part will become apparent to those skilled in the art upon examination of the following, or may be learned from the practice of the invention. The objects and advantages of the invention may be realized and attained by means of the instrumentalities and combinations particularly pointed out in the appended claims.

BRIEF DESCRIPTION OF THE DRAWINGS

FIG. 8 (panel b) back-gated graphene with Ag NPs; FIG. 8 (panel c) ionic-liquid top-gated graphene; FIG. 8 (panel d) ionic-liquid top-gated graphene with Ag NPs. The insets show the device geometries.

FIG. 9(b) transmittance curves of graphene, plasmonic graphene with and without ionic liquid covered (left column), and $I_D$ change dependence on wavelength of light source.

FIG. 10 (panel b) shows the ID-t curve to light on-off cycles at 180 K using 20 Hz chopper, so each cycle being about 50 ms.

DETAILED DESCRIPTION OF PREFERRED EMBODIMENT

Figure 1:
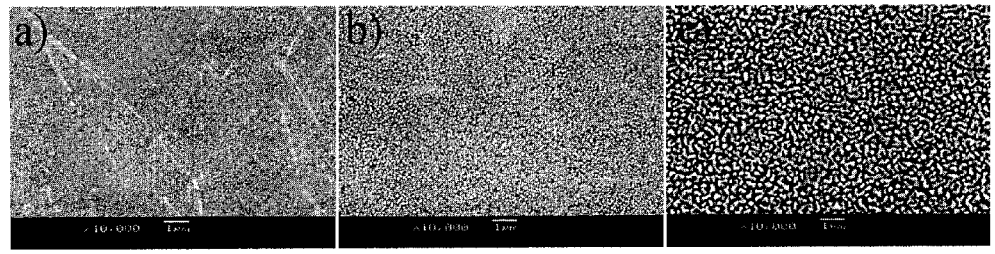
FIG. 1 are scanning electron micrographs ("SEMs") of graphene transferred on a Si coating with 300 nm $SiO_2$ substrate and decorated with Ag NPs formed through thermal annealing Ag films of thickness of, respectively, (a) 4 nm; (b) 8 nm; and (c) 14 nm evaporated on graphene.

The present invention is directed to a method for forming plasmonic nanostructures on graphene sheets in a self-assembly fashion and the plasmonic graphene compositions formed using such a method. The method includes the steps of forming a graphene sheet on a support substrate; depositing a film of a plasmonic material on the graphene sheet; and heating the graphene sheet with the plasmonic material to form the plasmonic graphene having plasmonic nanostructures thereon.

In general, the plasmonic graphene prepared using the method of the present invention comprises graphene sheets with a plurality of plasmonic nanostructures. The plasmonic nanostructures may have various morphologies (spherical, rods, disks, prisms, etc.). Exemplary nanostructures include those made of gold, silver, copper, nickel, and other metals, for example gold nanoparticles, silver nanoparticles, copper nanoparticles, nickel nanoparticles, and other transition metal nanoparticles. In general, any electrically conductive materials, such as oxides and nitrides, of surface plasmonic resonance frequencies in the visible spectrum for photovoltaic applications can be made into plasmonic nanostructures for the same purpose. In the examples, metal nanoparticles were used because their plasmonic resonance frequencies (determined by electron density-so related to electrical conductivity linearly, dimension and shape of the nanoparticles) are in the visible range, which is desired for ultrathin film photovoltaic (using visible light) or photodetectors or any other optical devices in visible range. The plasmonic nanostructures could also be made with other semiconducting materials which will have lower resonance frequencies in infrared or longer wavelengths.

In exemplary embodiments, the plasmonic nanostructures have a size of about 1 nm to about 200 nm (e.g., about 10, 50, 100, 150, or 200 nm or some range therebetween). The size and shape of the plasmonic nanostructures will depend on the materials being used and their interfaces with graphene, and can be tuned and controlled as desired. In one aspect, the goal is to enhance the plasmonic effect of light trapping, to tune the plasmonic resonance frequency to the right value, and to minimize the Ohmic loss on the particle surface. For example, if silver nanostructures are desired, the best lateral dimension is typically about 50 to 100 nm in a disk or hemisphere shape. It will be appreciated that the size and shape of the plasmonic material will depend on the specific application. In the case of photovoltaic applications, the nanostructures are preferably disk-like in shape which minimizes loss, and the lateral dimension on the order of tens to about 100 nm.

The graphene sheet may be prepared by any suitable preparation method, such as mechanical exfoliation, chemical exfoliation, heat treatment of SiC, chemical vapor deposition, epitaxial synthesis, or organic synthesis. The graphene sheet is typically grown using chemical vapor deposition. In an exemplary embodiment, the graphene sheet is grown on a substrate using chemical vapor deposition. The graphene sheet may be transferred to a suitable support substrate, such as silicon dioxide, glass, or inert polymers. The substrate is preferably one that is chemically and physically inert during thermal heating of the graphene sheet.

In an exemplary embodiment, a graphene sheet is grown on a substrate (e.g., copper substrate) using chemical vapor deposition. A polymer layer is the provided on the graphene sheet, such as by spin-coating a PMMA layer onto the graphene sheet. The substrate (e.g., copper substrate) is removed by contacting said substrate with a suitable etchant (e.g., iron chloride solution). The graphene is then transferred to the support substrate (e.g., silicon dioxide or glass). The polymer (e.g., PMMA) is then removed using a suitable solvent (e.g., acetone and/or using $Ar/H_2$ at elevated temperatures).

The graphene sheets preferably comprise one, two, or three layers of graphene. The graphene sheets, however, may comprise about 1 to 20 layers of graphene (e.g., 1, 2, 3, 4, 5, 6, 7, 8, 9, 10, 11, 12, 13, 14, 15, 16, 17, 18, 19, or 20 layers or some range therebetween). The thickness of the graphene sheet is preferably less than 10 nm (e.g., 10, 9, 8, 7, 6, 5, 4, 3, 2, 1, 0.8, 0.6, 0.4, 0.2 nm or less or some range therebetween).

Plasmonic material (which includes metals or semiconductors) is then deposited in a film or layered manner onto the graphene sheets. For visible applications, the plasmonic material is preferably selected from the group consisting of silver, gold, copper, or mixtures thereof considering that their plasmonic resonance frequencies fall into the visible spectrum. Methods for depositing the plasmonic material in a layered or film format include electron beam deposition, thermal evaporation, sputtering, and electroplating.

Typically, the layer or film of plasmonic material that is deposited on the graphene has a thickness of about 1 to 15 nm (e.g., 1, 5, 10, or 15 nm or some range therebetween), most preferably about 4 to 10 nm (e.g., about 4, 5, 6, 7, 8, 9, or 10 nm or some range therebetween), still more preferably about 6 to 10 nm, and most preferably around 7 to 8 nm. The thickness of the plasmonic material is generally quite thin. The thickness of the plasmonic material file will affect the dimension and density of the plasmonic nanostructures on the graphene sheets.

The graphene sheet having the plasmonic material deposited in a layered or film manner thereon is then heated. Typically, the heating occurs at temperatures of about 200 to 500° C. (e.g., about 225, 250, 275, 300, 350, 400, 450, or 500° C. or some range therebetween) for about 5 to 200 minutes (e.g., about 5, 10, 15, 20, 25, 30, 45, 60, 75, 80, 100, 120, 140, 160, 180, or 200 minutes or some range therebetween). The temperatures and times selected will depend on the nature of the plasmonic material. For example, a temperature of about 200 and 300° C. (preferably about 250 to 270° C. and most preferably about 260° C.) is preferred for silver as the plasmonic material. Some metals like indium or tin could form nanostructures at about 160 to 230° C., while gold is preferably heated to about 400 to 500° C. In general, however, lower temperatures are preferred because that minimizes damage to the graphene. The temperatures needed for the plasmonic nanostructures to form also depends on the interface between the plasmonic material and the graphene. Likewise, the heating time may vary, depending on the plasmonic material. A heating time of about 20 to 40 minutes is preferred for silver as the plasmonic material, with a heating time of about 30 minutes being most preferred.

Heating causes the plasmonic material to form nanostructures on the graphene. Typically, as discussed above, the nanostructures have an average lateral dimension of about 1 to 200 nm (e.g., 1, 2, 3, 4, 5, 6, 7, 8, 9, 10, 15, 20, 30, 40, 50, 60, 70, 80, 90, 100, 110, 120, 130, 140, 150, 160, 170, 180, 190, or 200 nm or some range therebetween), with the nanostructures being mostly tens to about a hundred nanometers (e.g., about 10, 20, 30, or 40 nm up to about 150 nm or some range therebetween) considering the compromise of the plasmonic effect and losses, but the dimensions also will vary depending on plasmonic material used and also the shape of the nanostructures. The average height of the nanostructure is about 1 to 100 nm (e.g., 1, 2, 3, 4, 5, 8, 10, 15, 20, 25, 30, 40, 50, 60, 70, 80, 90, or 100 nm or some range therebetween), and the preferred average height is about 60 nm. Again, the height will depend on the plasmonic material used. Some of the exemplary silver nanostructures on graphene sheets made herein in the examples below are more or less disk-shaped (or cylindrical), which is one of the preferred shapes for silver.

As discussed in the examples below, the plasmonic graphene prepared in accordance with the present invention has an electrical conductivity that is higher than that using a graphene sheet without the plasmonic material. Further, the plasmonic graphene exhibits a higher G peak and 2D peak compared to a graphene sheet without the plasmonic material. The plasmonic graphene exhibits a red-shifted plasmonic resonance frequency compared to said plasmonic material on bare glass.

The plasmonic graphene prepared in accordance with the present invention is well adapted to be used in novel photovoltaic devices. In an exemplary photovoltaic device, the photovoltaic devices have first and second infrared transparent electrodes, one or both of which are comprised of the plasmonic graphene. An exemplary device is described in co-pending U.S. Provisional Patent Application Ser. No. 61/702,797 filed on Sep. 19, 2012, which is incorporated by reference in its entirety. The photovoltaic device comprises a photoactive element, which may be organic, inorganic, or organic-inorganic hybrids. A wide variety of photoactive elements are contemplated. Exemplary inorganic photoactive elements include those comprising a-Si, nc-Si, CdS, CdSe, CdTe, InP, InAs, ZnS, ZnSe, ZnTe, HgTe, GaN, GaP, GaAs, GaSb, InSb, Si, Ge, AlAs, AlSb, PbSe, PbS, or PbTe, $CuInSe_2$, $CuInS_2$, GaAs, CdS/$Cu_2S$, CdS/CdTe, CdS/InP, CdTe/$Cu_2Te$, $CuInGaSe_2$. Exemplary superlattice structures are disclosed in Wu et al., Ultrathin Group II-VI Semiconductor Layers, Group II-VI Semiconductor Superlattice Structures, photovoltaic Devices Incorporating the Same, and Related Methods, co-pending U.S. Provisional Patent Application Ser. No. 61/681,708, filed on Aug. 10, 2012, which is incorporated by reference in its entirety. In one aspect, the photoactive element comprises carbon nanoparticles and a carbon-based polymer network.

In one exemplary aspect, the carbon nanoparticles of the photoactive element are selected from the group consisting of multi-walled carbon nanotubes, single-walled carbon nanotubes, cut nanotubes, nanotubes comprising frequency converters, doped nanotubes, fullerenes, fullerene conjugates, higher order fullerenes, endometallofullerenes, or mixtures thereof.

In another aspect, the carbon nanoparticles of the photoactive element have a particle size ranging from about 1 nm to about 300 nm (e.g., about 10, 50, 100, 150, 200, 250, or 300 nm or some range therebetween). In some exemplary embodiments, the carbon nanoparticles have a length ranging from about 10 nm to about 1 μm (e.g., about 10, 20, 30, 40, 50, 60, 70, 80, 90, 100, 200, 300, 400, 500, 600 700, 800, or 900 nm or some range therebetween).

In one aspect, the carbon-based polymeric network of the photoactive element is selected from the group consisting of one or more conjugated polymers. Exemplary conjugated polymers are selected from the group consisting of polythiophenes, polyphenylenes, polyfluorenes, or combinations thereof. In still another aspect, the conjugated polymers may be selected from the group consisting of poly(3-hexylthiophene) ("P3HT"), poly(3-octylthiophene) ("P3OT"), and polythiophene ("PTh"). In a further aspect, the carbon-based polymeric network is selected from the group consisting of one or more semiconducting polymers. Exemplary semiconducting polymers are selected from the group consisting of phenylene vinylenes, such as poly(phenylene vinylene), polyp-phenylene vinylene) ("PPV"), polyfluorenes, and naphthalenes. In an exemplary aspect, the photoactive element comprises P3HT and single walled carbon nanotubes.

In one aspect, the photoactive element has a loading of carbon nanoparticles in the carbon-based polymer network of about 1% to 70% (e.g., about 1, 2, 3, 4, 5, 6, 7, 8, 9, 10, 20, 25, 30, 35, 40, 45, 50, 55, 60, 65, or 70% weight or volume percentage or some range therebetween).

In another aspect, the photoactive element has thickness ranging from about 30 nm to about 1 μm (e.g., about 30, 40, 50, 60, 70, 80, 90, 100, 150, 200, 250, 300, 350, 400, 450, 500, 550, 600, 650, 700, 750, 800, or 900 nm or some range therebetween).

In one aspect, the infrared transmission of the infrared transparent electrode(s) comprising the plasmonic graphene and/or the photovoltaic device is greater than about 70% (e.g., greater than about 70, 72, 74, 76, 78, 80, 82, 84, 86, 88, or 90% or some range therebetween).

In another aspect, the present invention is directed to photodetectors and sensors for various bio-, chemical-, and gas-molecules incorporating the plasmonic graphene of the present invention. Electrolytes and/or ionic liquids may be employed as the gating dielectric. In the present invention, the photoconductivity may be measured. In general, the photocurrent refers to the free electrons generated by photons absorbed while photoconductivity in the devices of the present invention is caused by the gating electric field change due to molecule redistribution or deformation. Exemplary photodetector devices using ion liquid top gate in which the plasmonic graphene of the present invention could be utilized are disclosed in Avouris et al., U.S. Pat. No. 8,053,782; Kim et al. U.S. Published Patent Application No. 2012/0161106, which are both incorporated by reference.

In still another aspect, the present invention is directed to field-effect transistors ("FETs") incorporating the plasmonic graphene of the present invention. Preferably, electrolytes and/or ionic liquids are employed as the gating dielectrics in electrical double-layer transistor ("EDLT") to achieve high gating efficiency. Other gating schemes can be employed for the plasmonic graphene-based detectors and sensors since the operation of these devices are most probably in the range of small gating electric fields near zero as demonstrated in the examples.

Suitable ionic liquids include those selected from the group consisting of but not limited to: a pyrrolidinium-based ionic liquids, a non-pyrrolidinium-based cyclic ammonium, a phosphonium-based cyclic ammonium, a spirocyclic ammonium- or phosphonium-based ionic liquid, an acyclic ammonium- or phosphonium-based ionic liquid, and any combinations thereof. Exemplary ionic liquids are disclosed in Bielawski, U.S. Published Patent Application No. 2011/0080689, which is incorporated by reference in its entirety.

The plasmonic graphene of the present invention and method of producing the plasmonic graphene will now be understood more readily by reference to the following examples, which are provided by way of illustration and are not intended to be limiting.

Example 1: Preparation of Plasmonic Graphene

Graphene was grown on commercial copper foils with 25 μm thickness at about 1000° C. in a CVD system using a similar procedure described elsewhere (see Liu et al. (2011)). In order to transfer the graphene films onto other substrates, PMMA was first spin-coated on the surface of the as-grown graphene on copper. Polymers such as PMMA are typically used because the graphene is one atom in thickness and the hexagonal mesh of graphene may crack or break when the graphene is removed from the copper foil. The sample was then placed in iron chloride solution (0.1 g/mL) to remove the copper foil, followed by rinsing with deionized ("DI") water before soaking in DI water before being transferred to a selected substrate, which in this example was silicon dioxide. The target substrate was then immersed in the DI water and alignment of the graphene on the substrate was made before the DI water was drained. After transferring, the sample was baked at 80° C. for one hour in an oven to eliminate moisture before removing the PMMA with acetone. The graphene was further cleaned to provide for a good deposition interface. More specifically, the graphene was treated in flowing $Ar/H_2$ at 400° C. for one hour to remove the PMMA residues (see Ishigami et al. (2007)). Ag films of 4 nm, 8 nm, and 14 nm in thickness were deposited onto the graphene samples using electron beam evaporation, with the Ag thickness being monitored in situ using a quartz crystal microbalance. The samples were then annealed in $Ar/H_2$ at 260° C. for 30 minutes for Ag NPs self assembly. In this example, 260° C. is the lower limit of the temperature window to obtain isolated Ag NPs for this experiment and lower processing temperatures were chosen to avoid damage of plasmonic graphene.

Example 2: Characterization of Structure/Morphology of Plasmonic Graphene

FIG. 1 depicts the scanning electron microscopy ("SEM") images of the plasmonic graphene made from the original Ag films of thickness of 4 nm, 8 nm, and 14 nm, respectively. A uniform distribution of the Ag NPs self-assembled on graphene was obtained after the thermal annealing. The size and shape of the Ag NPs were found to be dependent on the thickness of the original Ag film. At the thickness of 4 nm and 8 nm, circular shaped Ag NPs formed after the thermal annealing with average diameter of about 50 nm and 70 nm, respectively, as shown in FIGS. 1(a) and (b). At a larger thickness of 14 nm, elongated and irregular shaped Ag NPs appeared with average dimensions of about 150 nm. A study using atomic force microscopy ("AFM") reveals that both lateral and vertical dimensions of the Ag NPs increase with increasing thickness of the Ag film. The average heights of Ag NPs are 12 nm, 18 nm, and 57 nm, respectively, for the three samples shown in FIGS. 1(a)-(c). Therefore, by simply tuning the thickness of Ag film, the size, and shape of the Ag NPs on graphene can be varied. It is worthy of pointing out that at the same processing conditions the Ag NPs formed on the dielectric surfaces show smaller average lateral dimensions as compared to those on graphene (see Table 1), possibly due to the difference in the interfaces. The influence of the interface on the metal NP dimension has been reported earlier. For example, the average lateral dimensions of 136 nm, 124 nm, and 128 nm were observed for Ag NPs formed on glass, $Si_3N_4$, $TiO_2$ respectively by annealing 14 nm thick Ag film (see Beck et al. (2009)).

TABLE 1

Lateral dimensions of Ag NPs formed through thermal annealing from Ag films of different thickness on SiO2 and graphene/SiO2.

| Original Ag Film Thickness (nm) | Ag NPs on glass (Lateral dimension ± standard deviation) (nm) | Ag NPs on graphene (Lateral dimension ± standard deviation) (nm) |
| --- | --- | --- |
| 4 | 42.0 ± 4.7 | 49.3 ± 7.7 |
| 8 | 59.9 ± 8.7 | 67.5 ± 14.1 |
| 14 | 140.4 ± 42.1 | 147.5 ± 35.7 |

Example 3: Transmittance and Resonance Properties of Plasmonic Graphene

Localized surface plasmons are confined collective oscillations of the free electrons in metal NPs. Upon excitation with incident lights, the collective motion of the free electrons results in a buildup of polarization charges on the surface of metal NPs, which acts as a restoring force for the resonance occurrence at the surface plasmonic frequency (see Stockman (2011)). In the region of surface plasmonic resonance frequency (or wavelength λ), the incident light is strongly scattered or absorbed. Such a frequency is determined primarily by the charge carrier density of metal NPs and can be tuned in a moderate range by the size, shape, and surrounding medium of metal NPs. In general, NPs with larger lateral dimension tend to have more red-shifted frequency. FIG. 2(a) plots the optical transmittance vs. wavelength curves of Ag NPs of various dimensions on both the graphene/glass and bare glass substrates measured with an integrating sphere. For comparison, the transmittance for original graphene is also included, which is above 90% in almost the entire visible range and over 97% at the wavelength above 550 nm. In contrast, a dip in the transmittance curve appears on all other curves taken on glass and graphene/glass decorated with Ag NPs, suggesting the presence of the localized surface plasmonic resonance near the resonance frequencies at the dips. The resonance dip becomes shallower and broader and red-shifted when the lateral dimension of Ag NPs increases. Specifically, the resonance wavelengths are 440 nm, 452 nm, and 478 nm for 4 nm, 8 nm, and 14 nm Ag NPs on bare glass respectively. This result is comparable to what reported earlier by Beck et al. (2009) on the similar samples in terms of both the plasmonic resonance frequency and the magnitude of transmission (see Beck et al. (2009)). The transmittance curves for plasmonic graphene samples show a similar trend with the slightly red-shifted plasmonic resonance frequencies of 446 nm, 460 nm, and 495 nm for Ag NPs annealed from 4 nm, 8 nm and 14 nm Ag films on graphene respectively. Such red-shifted plasmonic frequencies can be attributed to combined effect of increased size of Ag NPs (see Table 1) and refractive index of surrounding medium (ng=2.415 for graphene, higher than np=1.5 for pyrex glass), which is consistent with the previous report that higher refractive indices in the substrate would result in longer resonance wavelength (see Xu et al. (2003)). Comparing to the Ag NPs on glass case, the plasmonic resonance of Ag NPs on graphene is damped to some extent when the graphene layer is added between the Ag NPs and the glass substrate. This variation may be attributed primarily to the conductivity of the graphene which dissipates the electrical field concentration on the surface of the Ag NPs. To confirm this, transmittance spectra of plasmonic graphene with different layers of graphene were taken, shown in FIG. 2(b), which indicate dependence of the plasmonic resonance of plasmonic graphene on layers of graphene. Indeed, comparing to Ag NPs on bare glass, the plasmonic resonance of Ag NPs on graphene damps with the increasing layers of graphene, shown in FIG. 2(c). Therefore, multilayer graphene which possesses better conductivity (see Liu et al. (2011)) facilitates the dissipation of electrical field concentration on the surface of the Ag NPs, which results in the decrease of amplitude of their plasmonic resonance. It is worth pointing out that plasmonic resonance frequency red-shifts with layers of graphene, from 420 nm for Ag NPs on bare glass to 440 nm on 3-layers graphene, as indicated in FIG. 2(c). There is a slight difference of plasmonic resonance frequency for 4 nm Ag NPs shown in FIGS. 2(a) and (b), which is most probably caused by run-to-run variation during the sample fabrication.

To quantify the effect of the graphene on the plasmonic effect, an FDTD simulation was performed using the FULLWAVE simulation package from R-Soft Inc. (Ossining, N.Y.). In the simulation, an ideal Ag disk with 10 nm thickness and 40 nm diameter was placed on the front surface of the semi-infinite glass substrate, and a plane lightwave was normally launched with a single polarized electrical field $E_x$. The simulation area was 60 nm×60 nm in the horizontal dimension, and 20 nm into the substrate in the direction normal to the interface. Perfectly matched layer ("PML") conduction was used for the boundary of simulation window which absorbs the energy without inducing reflections. Only one Ag disk was included in the simulation area to reduce the simulation time. As a consequence, the effect of interference between different Ag NPs was not included. Optical power flow was integrated over a box surrounding the Ag disk using the Q-calculation function of the simulation package, and the calculated Q value is proportional to the absorption cross section of the Ag NP. Drude model was used for dielectric function of Ag, and a complex refractive index was used for graphene (see Wang et al. (2008)). FIG. 2(d) shows the calculated Q-values as the function of wavelength for Ag disk on glass substrate without graphene (open circles), with a single layer of 0.7 nm thick graphene (open squares) and with 2 nm thick multi-layer graphene (stars). The calculated plasmonic resonance wavelength is approximately 470 nm for the 40 nm Ag disk directly on glass substrate. Adding a single layer graphene interface between the Ag disk and the glass substrate has an effect to damp the plasmonic resonance and introduce a slight resonance shift towards longer wavelength. This effect becomes more evident when a multi-layer graphene is used at the interface. In this case, the resonance peak moves to approximately 530 nm as shown in FIG. 2(d). Note that plasmonic resonance is the major reason for the decreased transmittance near the peak resonance wavelength as shown in FIG. 2(a). Although the calculated Q-value evaluated the strengths and peak wavelengths of the plasmonic resonances for different interface conditions, it is only capable of providing qualitative explanation of the experimentally observed resonance absorption instead of quantitative fitting to the experiment since the latter requires more detailed numerical analysis. Nevertheless, the simulated results show consistency in both damping of plasmonic resonance and red-shifting of plasmonic frequency with increasing layer number of graphene.

Figure 3:
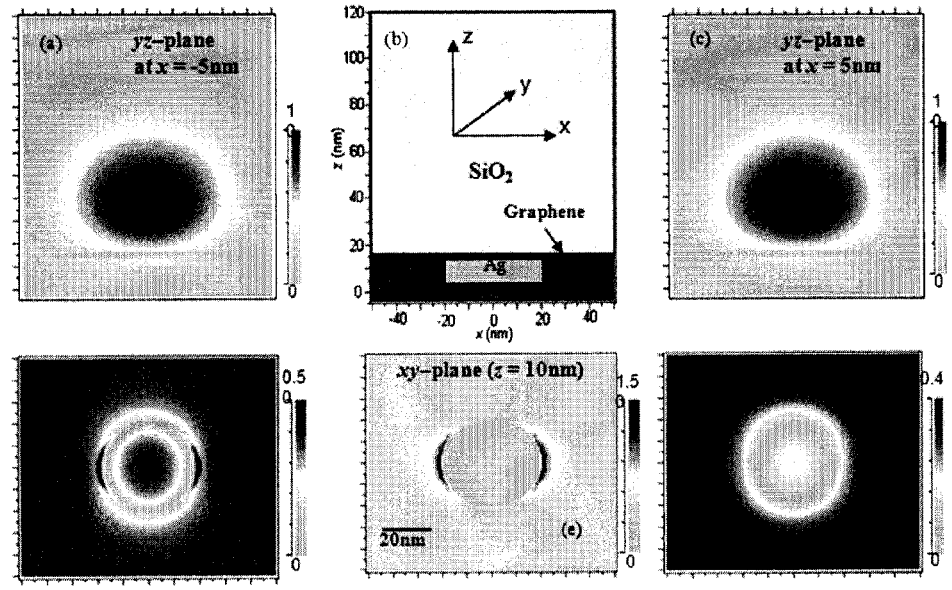
FIG. 3 shows the simulated field distributions measured with monitors placed at different locations and directions. Pane (b) shows the simulation configuration, and the distribution of optical field in the yz plane at (panel a) x=−5 nm, (panel c) x=5 nm and in the horizontal xy plane at (panel d) inside Ag NP with z=10 nm, (panel e) inside the graphene layer with z=15 nm and (panel f) inside the substrate with z=20 nm.

FIG. 3 shows the simulated intensity distribution of electrical field on the surface of monitors placed at several different locations and directions. FIG. 3(b) illustrates the simulation configuration in which a plane wave with a single polarized $E_x$ component is illuminated upward from the bottom, and the 2 nm thick graphene interface is placed between 14 nm and 16 nm in z-direction. FIGS. 3(a) and (c) show the distribution of optical field in the yz-plane propagating horizontally towards ±x directions, which confirms the scattering of light by the Ag NP. FIGS. 3(d), (e), and (f) show field distributions measured on the horizontal xy-plane at three different locations of z. At z=10 nm the plane is inside the Ag disk and highly concentrated field near the Ag disk sidewall due to the plasmonic effect is clearly demonstrated (FIG. 3(e)). FIG. 3(d) was measured at z=15 nm, the plane inside the graphene layer where the field started to scatter in the horizontal direction. Inside the substrate at z=20 nm, FIG. 3(f) shows the widely spread field in the horizontal plane. Therefore, due to introduction of Ag NP on the graphene, facilitated light scattering is expected to be obtained.

Example 4: Raman Characterization of Plasmonic Graphene

Figure 2:
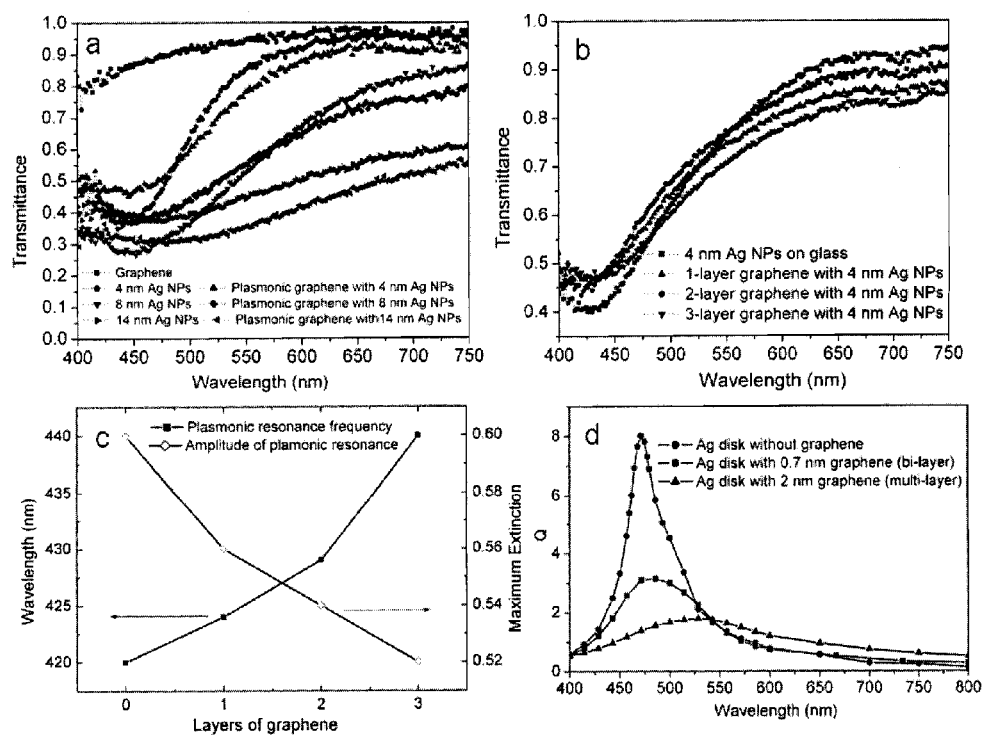
FIG. 2(a) shows the transmittance spectra taken on original graphene (curve with cubes) and plasmonic graphene on glass substrates (curve with triangles ▲ and diamonds ◇) showing red-shift of the surface plasmonic resonance frequency with increasing thickness of the Ag film (or increasing lateral size of the Ag NPs). The transmittance spectra of Ag NPs on glass substrates (curve with circles ● and triangles ▼) made in the same runs with the corresponding plasmonic graphene are also included for comparison.
FIG. 2(b) shows the transmittance spectra of 4 nm Ag NPs on bare glass and graphene of 1, 2, and 3 layers on glass.
FIG. 2(c) shows the plasmonic resonance frequency and amplitude with respect to graphene layers.
FIG. 2(d) shows the simulated Q-values of Ag disk with 10 nm thickness and 40 nm diameter without graphene (curve with circles ●) with 0.7 nm graphene layer (curve with cubes ■) and with 2 nm graphene layer (curve with triangles ▲) between the Ag disk and the glass substrate.
Figure 4:
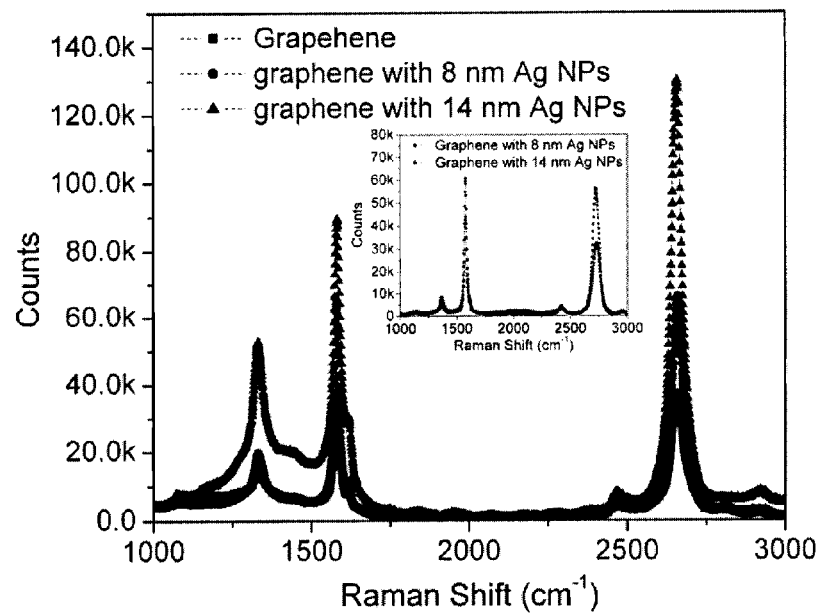
FIG. 4 shows the normal Raman and SERS spectra of the original (black) and plasmonic graphene measured using 633 nm laser excitation. The SERS spectra for the Ag NPs on glass made in the same run with the corresponding plasmonic graphene are also included for comparison. Inset shows SERS spectra using 442 nm laser excitation.

FIG. 4 depicts normal Raman and surface enhanced Raman scattering ("SERS") spectra of single layer graphene before and after Ag NP deposition using 633 nm (and 442 nm, the inset) excitation laser with 5 scans for average. SERS is mainly due to the excitation of surface plasmons with the incident light striking at the sample surface. The maximum enhancement is obtained when the plasmonic frequency is in resonance with the excitation. Therefore, the enhancement of the Raman scattering depends on the resonance frequency of plasmonic graphene, which can be tuned by the size of Ag NPs, as discussed in FIG. 2. In FIG. 4, the two most intensive features associated with graphene, the G peak around 1580 $cm^{-1}$ and 2D peak around 2656 $cm^{-1}$, were observed on all samples. The 2D peak exhibits a single Lorentzian shape, which is the signature of monolayer graphene with a single-band electronic dispersion (see Ferrari et al. (2006)). The low intensity peak around 1330 $cm^{-1}$ is from the D band of carbon, suggesting insignificant population of defects in the CVD graphene used and remaining absorbents after graphene transferring. After Ag NP deposition, significant enhancement of intensity of both G peak and 2D peak suggests excitation of surface plasmons in plasmonic graphene. The enhancement factors (ratio of Raman peak intensity of plasmonic graphene and graphene) at G peak are 1.3 and 1.8, at 2D peak being 1.3 and 2.5 for plasmonic graphene with 8 nm and 14 nm Ag NPs respectively. The peak ratios of plasmonic graphene with 14 nm and 8 nm Ag NPs are 1.4 at G peak and 2.5 at 2D peak, indicating enhancement factors at both G peak and 2D peak increases with size of Ag NPs. Such increase is presumably due to the factor that resonance frequency of plasmonic graphene approaches the wavelength of excitation laser, as indicated in FIG. 2(a). To confirm this, Raman measurement was done using a 442 nm blue laser excitation, as shown in the inset of FIG. 4. In contrast to the 633 nm laser case, the peak rations of plasmonic graphene with 14 nm and 8 nm Ag NPs drop to 0.7 at both G and 2D peaks. The greater enhancement of the graphene modes was observed in graphene sample with 8 nm Ag NPs decoration, whose plasmonic frequency at 437 nm is closer to the wavelength of the blue laser (442 nm).

Example 5: Conductivity of Plasmonic Graphene

Figure 5:
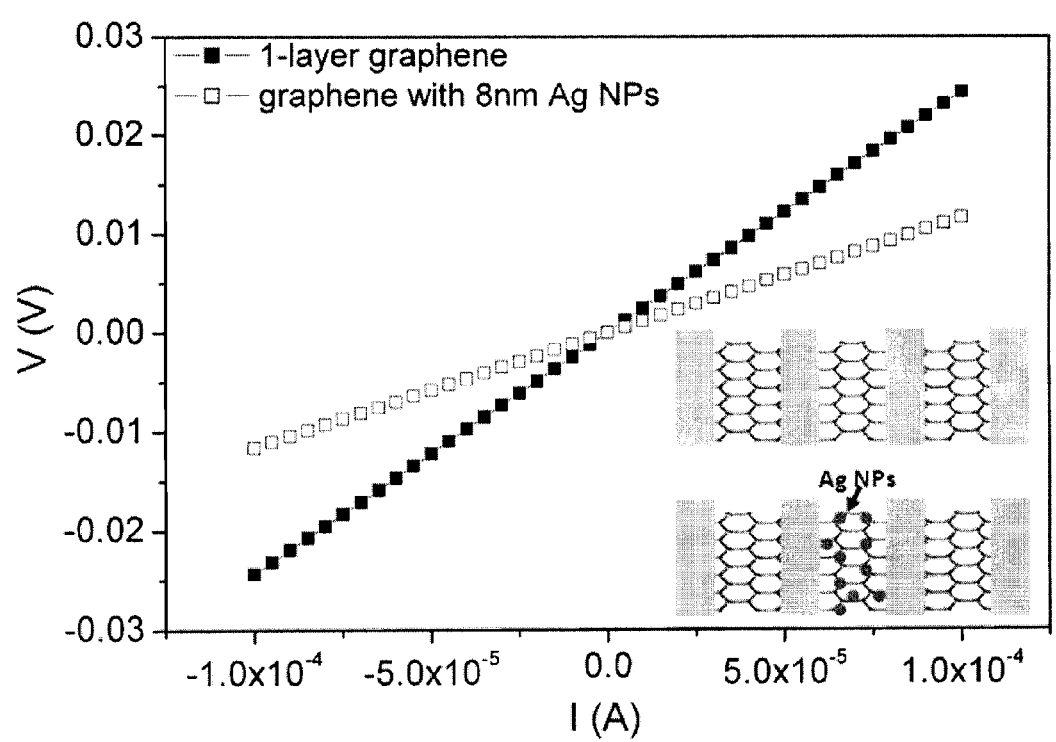
FIG. 5 shows the improved conductivity of 1-layer graphene decorated with NPs formed from 8 nm thick Ag as compared to the original CVD graphene. The inset shows the schematics of 4-probe measurements of graphene and plasmonic graphene.

Besides light scattering facilitated by the Ag NPs on graphene, significantly enhanced electrical conductivity is also obtained in the plasmonic graphene. FIG. 5 compares the I-V curves for the same graphene before (solid) and after (open) Ag NP (from 8 nm Ag film) decoration. The standard 4-probe measurement was employed for the transport measurement. Control samples of bare Ag NPs on glass substrates and graphene with electrodes on Si substrates processed at the same condition for the plasmonic graphene were used to confirm: (1) the Ag NPs generated are not continuous; and (2) there was no significant change of the contact resistance on graphene. After deposition of NPs from 8 nm thick Ag film onto graphene between the voltage electrodes, shown in the inset of FIG. 5, the sheet resistance decreased from a range of about 800-3000 Ω/square for the original single-layer graphene to 400-1000 Ω/square, as indicated in FIG. 5. Single-layer graphene upon deposition of NPs of 4 nm and 14 nm Ag shows similar trend, with conductance improves by a factor of 2 and 4 respectively. This, in combination with the surface plasmonic effect, makes plasmonic graphene a promising alternative to ITO and FTO for optoelectronic applications such as thin film solar cells.

In conclusion, plasmonic graphene was fabricated on CVD graphene using thermally assisted self-assembly of Ag NPs from coated Ag thin films on graphene. Strong surface plasmonic resonance was confirmed from both transmittance and Raman measurements. The surface plasmonic resonance frequency shifts from 446 nm to 495 nm when the lateral dimension of Ag NPs increases from about 50 nm to 150 nm as Ag film thickness changes from 4 nm to 14 nm. The presence of the graphene causes these frequencies red-shifted as compared to the case without graphene. Both the plasmonic frequency and amplitude of surface plasmonic resonance decrease with increasing number of the graphene, which is consistent with the simulation. In addition, the plasmonic graphene shows much improved electrical conductance by a factor of 2-4 as compared to the original graphene. These results suggest plasmonic graphene transparent TCs could be used to enhance light scattering and absorption in thin film solar cells and other optoelectronic devices.

Example 6: Photodetection

Figure 7:
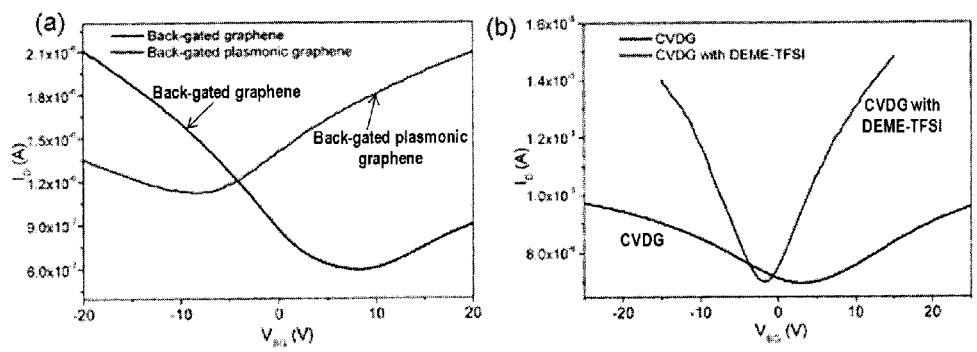
FIG. 7 (panel a) shows the $I_D$-$V_G$ curve of CVD graphene before and after Ag nanoparticle deposition; and (b) $I_D$-$V_{BG}$ curves of reference sample of back-gated graphene with and without ionic liquid.
Figure 8:
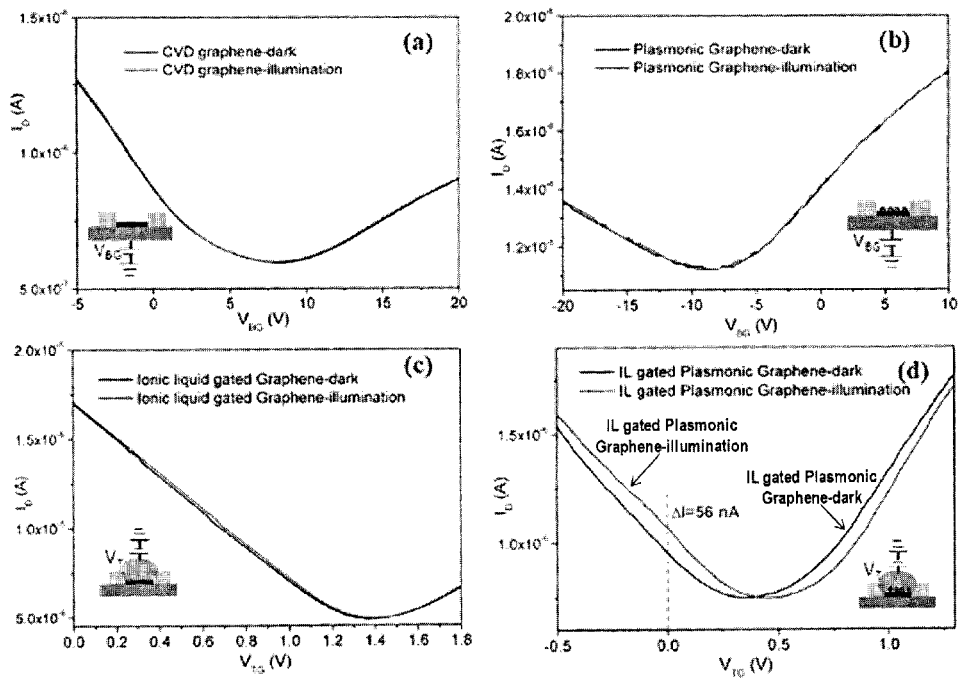
FIG. 8 (panel a) shows the $I_D$-$V_G$ curve measured at dark and illumination for four kinds of devices: (a) back-gated graphene.

In this example, photodetection based on ionic liquid gated graphene with plasmonic metal nanostructures performed. Upon illumination, the locally generated electromagnetic field (evanescent or near field) around the metal nanostructures change the configuration (either geometry or location) of the ions in the proximity to the graphene surface, resulting in the alteration of interfacial capacitance of ionic liquid as well as quantum capacitance. The corresponding gating field change leads the Fermi level change in graphene, illustrates in shift of the Dirac point (the minimum conductivity point shown in the I-V curves in FIGS. 7 and 8) the change of the conductivity, leading to photoresponsivity up to about 140 mA/W. This device shows strong light wavelength selectivity determined by the plasmonic resonance frequency of the metal nanostructures on graphene.

The charge carrier density and hence conductivity of graphene is highly susceptive to the gate electric field and can be tuned through gate electrostatic field $E_G$. In fact, this gating effect is ambipolar as evidenced from monotonic shifting of the Fermi level of graphene with the gate field at both positive and negative polarity. The on/off ratio is as high as over 5 in graphene field-effect transistors ("FETs") at $E_G$ about 3 MV/cm (Xia 2010). Higher gating efficiency, defined as the change of the graphene channel conductivity per the applied gate voltage $V_G$, can be obtained at larger gate capacitance, which can be achieved by using thinner high-K dielectrics. One possible alternative is to use ionic liquid and/or electroleye gate. In fact, an ionic liquid or electrolyte gate represents one of the most efficient gates due to the formation of an electric double-layer with extremely small spacing on the order of few Å (the Debye length) near the graphene/electrolyte interface. This renders a high electrical gate field (see Sandberg (2004) and Yuan (2009)). Electrolyte gated graphene FETs reveals the measured double-layer capacitance is as high as 9.2 to 21 µF/cm$^2$ (see Xia (2009) and Ye (2010)) approximately 2-3 orders of magnitude higher than the back-gate capacitance using a layer of 90 nm SiO$_2$ (38 nF/cm$^2$). Electrolytes or ionic liquids have been actively employed as the gating dielectrics in electrical double-layer transistor ("EDLT") to achieve high carrier density in semiconductor (see Sandburg (2004) and Shimotani (2009)) and even superconductors (see Ye (2010)). Electrolyte-gated graphene has shown to reach a doping level up to 5×10$^{13}$/cm$^2$ (see Das (2008)), mainly due to the ultrahigh breakdown field on the order of 10 MV/cm (see Kotz (2000)), providing powerful tunability of electronic states of variety of materials and systems, including graphene (see Das (2008) and Ye (2011)). It will be appreciated to those skilled in the art that the gating described in this example should not be construed as limiting the present invention. For example, the present invention could utilize a regular dielectric gate plus some molecules that are attached to the plasmonic graphene. When these molecules are deformed by the plasmonic field, they could cause the change of the graphene conductivity.

The electrical gating of the double-layer capacitance in an ionic liquid may be correlated to an incident light through incorporation of plasmonic nanostructures on graphene. An evanescent field is generated near the nanostructure surface as a consequence of localized surface plasmonic resonance ("LSPR") upon absorption of light with matching frequency to LSPR of the nanostructure (see Yin (2008)). Setting up a correlation between light induced evanescent field and the graphene FET gating mechanism may provide an efficient way to generate large photoconductivity in graphene and hence a new scheme for photodetection. A particular advantage of this scheme is the tunability determined by the LSPR frequency of the plasmonic nanostructure. By selecting plasmonic nanostructures of desired LSPR frequencies, photodetection at the targeted frequency range may be realized in a broad spectrum determined by the materials and geometric parameters of the plasmonic nanostructures.

In this example, a graphene photodetector based on plasmonic graphene (i.e., self-assembled Ag plasmonic nanostructures FETs with ionic liquid gate was investigated. Ag nanoparticles ("Ag NPs") were used as the plasmonic nanostructures on graphene with the LSPR occurred at near 460 nm for Ag NP diameters around 60 nm. Coupling the plasmonic evanescent field generated from the Ag NPs to gating upon light illumination was achieved via incorporation of the ionic liquid top gate, which is transparent to allow incidence of light and is responsive to light-induced evanescent field via the electric double-layer deformation. This deformation results in a perturbation to the gate electric field and hence the interfacial capacitance (which is the double-layer capacitance mentioned above) in EDLT and the quantum capacitance of graphene, both contributing to the tuning of graphene conductivity. It is worth pointing out that this scheme is different from Liu (2011)'s work, in which the plasmonic enhanced light absorption in graphene leads to the enhancement of the local photocurrent but the net photocurrent remains zero with broad-beam illumination over the entire sample with symmetric electrode configuration (i.e., zero net photocurrent due to the same and opposite photocurrent at source and drain electrodes, respectively, where symmetric Schottky-type barriers are formed at the graphene-metal junctions). The conductivity change in the example of the present invention (symmetric source and drain electrodes and uniform illumination) is not caused by the generation of photocurrent, but by the perturbation of ions distribution in graphene EDLT couple with the evanescent field generated from the plasmonic nanostructures upon light illumination.

More specifically, plasmonic graphene was prepared in accordance with the present invention. Briefly, graphene was grown at about 1000° C. in a CVD system on commercial copper foils of about 25 µm in thickness. In order to transfer the graphene films onto other substrates, PMMA was spin-coated on the surface of the as-grown graphene on copper. The sample was then submerged in copper etchant (CE100) to remove the copper foil, followed by rinsing with diluted HCl acid (1:10 as HCl:DI water) for etching possible copper oxide residues and with DI water for multiple times before being transferred to a designated substrate. After transferring, the sample was baked at 80° C. for one hour in an oven to eliminate moisture. A droplet of PMMA was applied and dried at atmosphere to release the stress before soaking in acetone. The graphene was further treated in flowing Ar/$H_2$ (about 1:1) at 400° C. for 1 hour to remove the PMMA residues. Plasmonic Ag NPs were obtained using thermally assisted self-assembly of 8 nm thick Ag film on graphene.

Figure 6:
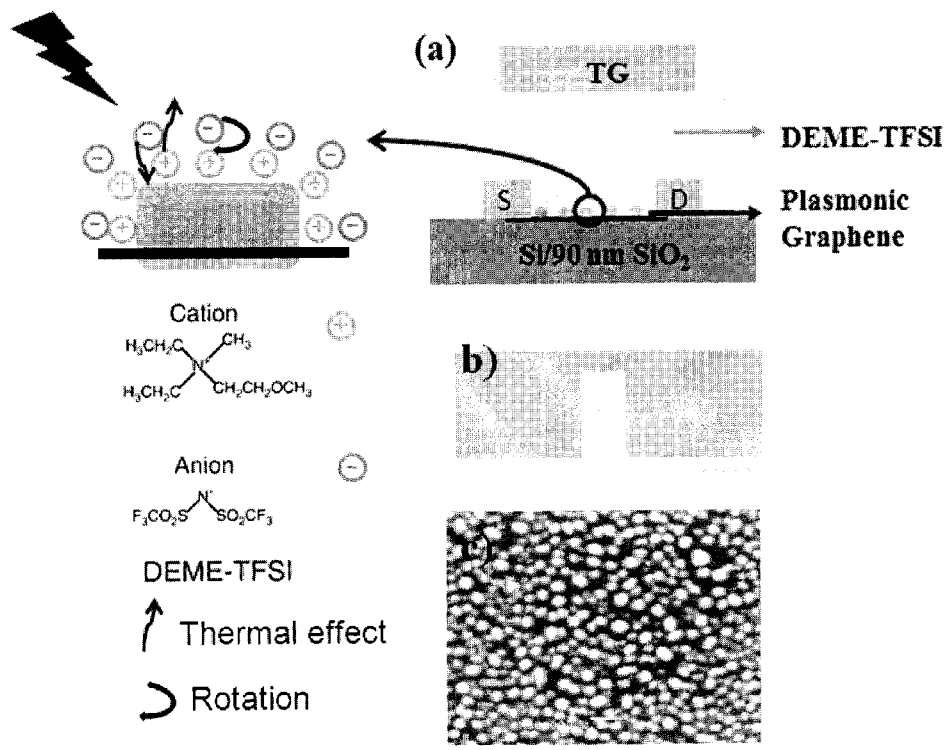
FIG. 6 (panel a) shows the schematics of ionic liquid gated (top gate) graphene with plasmonic nanostructures on Si substrate capped with 90 nm $SiO_2$ (back gate), and the inset shows the schematics of ion distribution around Ag nanoparticles. Panel (b) shows the optical image of graphene between source and drain electrodes (scale bar 50 µm). Panel (c) shows the SEM image of Ag nanoparticles annealed from 8 nm Ag film (scale bar 200 nm).

A sheet of centimeter-size single-layer CVD graphene transferred onto Si substrate capped with a thermal oxide layer of 90 nm in thickness was patterned to an array of EDLT devices using double-layer photolithography (LOR3B and S1813 photoresist) followed by reactive-ion etching. The transistor channel width is 20 µm while the channel length varies from 2 to 20 µm. Electrodes were formed by depositing 2 nm of titanium and followed by 88 nm of gold in a high vacuum electron-beam evaporator. Ag film was then deposited on the channel via a shadow mask, which was followed by thermal annealing in $H_2$/Ar at 260° C. for 30 minutes to form Ag NPs, shown in FIG. 6 (panels b-c), and Ag nanoparticles has an average size of about 60 nm. A droplet of ionic liquid was put to cover the graphene channel with plasmonic Ag NPs, as shown in the schematics of the device, FIG. 6 (panel a). In this work, the ionic liquid of N,N-diethyl-N-(2-methoxyethyl)-N-methylammonium bis-(trifluoromethylsulfonyl)-imide ("DEME-TFSI") was chosen owing to its large electrochemical window (±3 V), large capacitance and the minimized electrochemical reaction (see Ye (2010)). The morphology of the graphene with plasmonic nanostructures as well as pristine graphene was characterized using optical microscope and JEOL Scanning Electron Microscope (SEM). The optical property was measured using a Labsphere Integrating Sphere. The electrical characterization was conducted in Lakeshore Probe Station with Agilent B1500A Semiconductor Device Analyzer.

Before and after Ag nanoparticle deposition, the electrical transport curves of graphene FET were characterized in vacuum (5×$10^{-6}$ Torr), shown in FIG. 7(a). With source-drain voltage fixed at 10 mV, the back-gate voltage was scanned from −20 V to 20 V. The Dirac point voltage of CVD graphene is around 8.4 V, which is expected from low level of p-doping typically in CVD graphene probably due to the presence of growth defects. Upon deposition of Ag nanoparticles, the Dirac point voltage shift to −8.4 V, indicative of n-doping through Ag/graphene interface, which is consistent with previous reports and was attributed to electron doping from Ag to graphene (see Giovannetti (2008)). At the same time, the minimum conductance of graphene at the Dirac point increases by a factor of about 2.

After application of the ionic liquid on top of the graphene device with plasmonic nanostructures, the electrical transport curve was characterized with top gate geometry, shown in FIG. 7(b), using a platinum wire (0.25 mm diameter) immersed in the liquid as the top gate electrode. Due to the electrical double-layer capacitance of the ionic liquid, much smaller top gate voltage was needed to achieve the same gating efficiency as compared to the back-gate case. Similar to the measurement in the back-gate configuration, the source-drain voltage was fixed at $V_{SD}$=10 mV. The Dirac point voltage of graphene was found to shift to a positive value of about 0.3 V, and the minimum conductance drops almost back to the value for the original CVD graphene. Such a phenomenon may be caused by three factors due to the ionic liquid application to the graphene with plasmonic Ag NPs due to the changes in: (1) graphene itself, (2) Ag nanoparticles, or/and (3) graphene-Ag interface. To confirm it, a reference sample of pristine CVD graphene device was fabricated and it was characterized electrically through back-gate before and after the application of the ionic liquid on top of it with results shown in FIG. 7(b). After ionic liquid application, the Dirac point voltage is negatively shifted from about 3 V to about −2 V and the slope of the transfer characteristic curve (I-$V_G$) increases both in electron and hole branches, owing to an indefinite floating top-gate bias generated by the back-gate sweeping. The interfacial capacitance of the ionic liquid DEME-TFSI is about 9.2-21 µF/$cm^2$, over about 2-3 orders of magnitude higher than the back-gate capacitance. However, the minimum conductance of graphene at the Dirac point remains the same, indicating the application of the ionic liquid does not introduce significant charge scattering at graphene-ionic liquid interface. Therefore, the phenomenon that the minimum conductance drops in ionic liquid gated graphene device with plasmonic Ag NPs is very likely due to the reduction of charge screening effect from the ionic liquid. It is theorized that the neutrality point shift is caused by the degradation of the Ag nanoparticles, for instance, oxidation of Ag thus formation of thin oxide layer due to a very small extent of electrochemical reaction upon top gate voltage. As measurement went, it was observed that the neutrality point kept shifting toward the positive side and stopped shifting when a complete oxide layer formed at the surface of the Ag nanoparticles.

To examine the photoresponse of the ionic liquid gated graphene device with Ag NPs, white light with power intensity around 100 mW/$cm^2$ was used. The neutrality point shifted to the right toward the positive side from which one can conclude that such photoresponse is not attributed to the photocurrent generated in the graphene device, since the photocurrent by photo-excited carriers only contributes to lift the $I_D$-$V_{TG}$ curve upwards. In addition, considering the symmetric source and drain electrodes (both Ti/Au) configuration, zero net photocurrent is expected. In order to see the photocurrent effect, unbalanced electrical field produced with via the built-in voltage between a pair of Schottky electrodes typically made of two different metals, or p-n junctions, or via applied external voltage, is necessary to separate the photo excited electron-hole pairs inside the graphene. Considering the first two cases do not apply in this invention and the low source-drain bias $V_{SD}$=10 mV, the photocurrent mechanism may be ruled out in the current invention.

In fact, the neutrality point (or Dirac point) shift indicates the change of electric field at a given top gate voltage upon illumination, which may be directly related to the change of the interfacial capacitance $$C_{IC} = \frac{\varepsilon \varepsilon_0}{t},$$

where t is separation of accumulated ions from the graphene surface in the case of using ionic liquid as top gate dielectrics. From the definition of interfacial capacitance, only t is responsible for its change. The neutrality point shift of the graphene upon illumination is very likely to be attributed to the change of separation of accumulated ions from the graphene. In other words, this photoresponse with neutrality point shift is caused by the deformation or modified distribution of accumulated ions at the graphene surface. In this circumstance, the quantum capacitance of graphene $C_{QC}$ has been taken into account since $C_{IC}$ is comparable to $C_{QC}$ and they are considered to gate the graphene in series. Thus the total gate capacitance C may be derived from, $$\frac{1}{C} = \frac{1}{C_{IC}} + \frac{1}{C_{QC}} \quad (1)$$

In graphene, the quantum capacitance is defined as $$C_{QC} = \frac{e^2}{\pi \hbar v_F}\sqrt{\pi n},$$

where $v_F=1.1\times 10^6$ m/s is the Fermi velocity and n is the 2D charge carrier density in graphene. The combination effect of interfacial electrostatic capacitance as well as the quantum capacitance can be viewed from the equation below, in which the first term in Equation 2 is for quantum capacitance and second term is for interfacial capacitance:

$$V_{TG} - V_{Dirac} = \frac{\hbar v_F \sqrt{\pi n}}{e} + \frac{ne}{C_{IC}} \quad (2)$$

with $C_{IC}=9.2$ μF/cm², the following is obtained:

$$V_{TG}-V_{Dirac}=1.16\times 10^{-7}\sqrt{n}+0.173\times 10^{-13}n \quad (3)$$

Therefore, from Equation (3), the contribution from interfacial capacitance cannot be neglected when the carrier density of graphene is on the order of 10¹²/cm² or higher. Such a change of interfacial capacitance of accumulated ions on the graphene leads to the shift of neutrality point of graphene. On the other hand, the change of interfacial capacitance will lead to the change of carrier density in graphene at a given gate voltage, which in turn changes the quantum capacitance of graphene based on Equation (2), resulting in the shift of transfer characteristic curve of graphene with respect to the sweeping gate voltage. Thus, modification of distribution of ions on the surface of graphene leads to the shift of neutrality point of graphene upon illumination. It is worthy pointing out again that such photoresponse is different from previous works on graphene photodetectors (see Xia (2009), Liu (2011), Echtermeyer (2011), Muller (2010)), in which a photocurrent is generated. In this example, the interfacial capacitance of the ionic liquid as well as the quantum capacitance of graphene was varied upon light illumination via LSPR (localized surface plasmon resonance) field, resulting in a photoresponse through photoconductivity.

To quantify the photoresponse, the photo-induced $I_D$ change at zero gate voltage was selected to minimize the power consumption in real application, shown in FIG. 8(d). At zero top gate voltage, the $I_D$ change upon illumination is around 56 nA, which results in photoresponsivity of 140 mA/W, corresponding to photoconductivity of 14 S/W based on the size of the graphene device (20×20 μm²), indicated by the simple calculation below. The photoresponsivity about 20 times higher than previous record of graphene based photodetectors (see Liu (2011)). In particular, this was obtained at almost zero gate voltage.

Photoresponsivity=

$$\frac{\text{Photo-induced-current}}{\text{Incident-light-power}} = \frac{56 \text{ nA}}{100 \text{ mW/cm}^2 \times (20 \text{ μm})^2} = 140 \text{ mA/W}$$

$$\text{Photoconductivity} = \frac{140 \text{ mA/W}}{10 \text{ mV}} = 14 \text{ S/W}$$

To determine the origin of the photoresponse, four kinds of devices were fabricated and measured: (1) back-gated graphene FET; (2) back-gated graphene FET with Ag NPs; (3) ionic liquid top-gated graphene FET; and (4) ionic liquid top-gated graphene FET with Ag NPs, shown schematically in FIGS. 8(a)-(d) respectively. Particularly, the $I_D$-$V_G$ curves in FIGS. 8(a), (b), and (d) were measured at the same graphene but at different stages of fabrication process of the final device-ionic liquid gated graphene device with Ag NPs to minimize the complication of caused by sample-to-sample variations. FIG. 8(c) was measured at a different graphene sample prepared using a presumably identical procedure. For each device, the $I_D$-$V_G$ curves at dark and illumination were depicted. They clearly show that for back-gated and ionic liquid top-gated graphene, back-gated plasmonic graphene, there is barely any photoresponse that can be observed. This is somewhat expected due to the lack of unbalanced exciton dissociation mechanism in these cases. The photoresponse only appeared in the case of the ionic liquid top-gated plasmonic graphene and the result was highly reproducible. This means it is the combination of the plasmonic nanostructures and ionic liquid top gate that plays the key role in generating the observed photoresponse. In particular, this photoresponse stems from the gate electric potential on the plasmonic graphene FETs induced by the LSPR evanescent field upon illumination.

Figure 9:
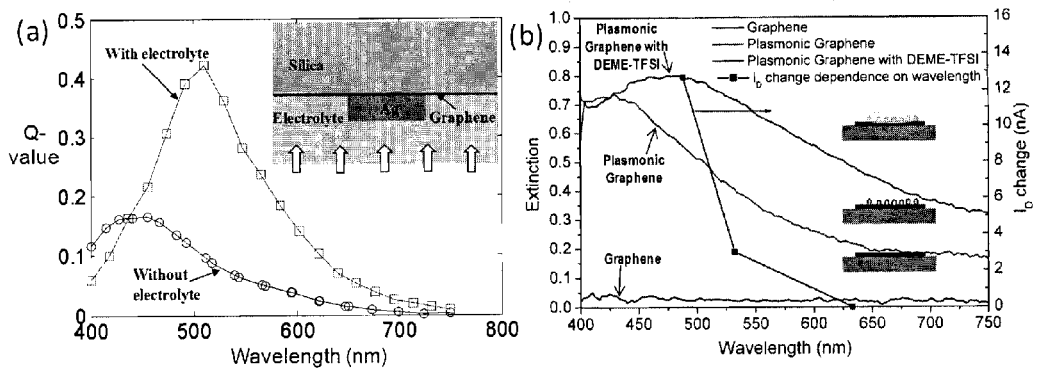
FIG. 9 (panel a) shows the resonance Q-value as the function of wavelength. Ag disk has 10 nm thickness and 40 nm diameter. Refractive index is n=1.4 for both silica and for electrolyte.

To confirm this response is originated from the locally enhanced plasmonic field around Ag nanoparticles due to surface plasmon resonance, single waveband laser beams with various wavelengths were used. Prior to the photoresponse measurement, surface plasmonic wavelength of graphene with Ag NPs immersed in ionic liquid was determined by both simulation and direct optical transmittance measurement, shown in FIG. 9. To understand the mechanism of graphene with plasmonic nanostructures, and the impact of the ionic liquid on the plasmonic resonance, FDTD simulation was performed using the FULLWAVE simulation package from R-Soft Inc. In the simulation, an ideal Ag disk with 10 nm thickness and 20 nm diameter was placed on the front surface of a silica substrate representing the 90 nm oxide layer on silicon. A plane lightwave was normally launched with a single polarized electrical field $E_x$. The simulation area was 60 nm×60 nm in the horizontal dimension, and 20 nm into the substrate in the direction normal to the interface. Perfectly matched layer ("PML") conduction was used for the boundary of simulation window which absorbs the energy without inducing reflections. As illustrated in the inset of FIG. 9 (panel a), only one Ag disk was included in the simulation area to reduce the simulation time. As a consequence, the effect of interference between different Ag NPs was not included. Optical power flow was integrated over a box surrounding the Ag disk using the Q-calculation function of the simulation package, and the calculated Q value is proportional to the absorption cross section of the Ag NP. Drude model was used for dielectric function of Ag, and a complex refractive index $n_g=2.4+i \cdot 1$ was used for graphene (see Wang (2008)). FIG. 9 (panel a) shows the calculated Q-values as the function of wavelength for an Ag disk on glass substrate with (open squares) and without (open circles) ionic liquid immersing the Ag disk. The calculated results indicate that plasmonic resonance wavelength is approximately 430 nm for plasmonic graphene without the ionic liquid, while this resonance wavelength red-shifts to about 500 nm when the ionic liquid is applied. When ionic liquid replaces the semi-infinite free-space, the average material refractive index surrounding the Ag disk increase, leading to the red shift of the plasmonic resonance wavelength.

Direct measurement of transmittance curves of plasmonic graphene shows consistent results, shown in FIG. 9 (panel b). The transferred CVD graphene on glass substrate shows wideband absorption (about 2-3%). After deposition of Ag nanoparticles, plasmonic resonance is introduced at the wavelength around 430 nm, suggested by the peak in the extinction curve. The resonance wavelength is slightly lower which could be due to sample variation. With application of the ionic liquid, DEME-TFSI, whose refractive index is around 1.4-1.5 (see Bonhote (1996)), the plasmonic wavelength red-shifts to 480 nm due to increased refractive index of the medium surrounding the Ag nanoparticles (see Xu (2003)). Based on the plasmonic wavelength of plasmonic graphene immersed in ionic liquid, narrow spectral linewidth lasers at visible wavelengths of 488 nm, 532 nm, and 633 nm as well as infrared ("IR") light source (wavelength >900 nm) were chosen for optical illumination. The optical power intensity of these light sources was set at the same value in the experiment. Indeed, with the 633 nm laser and the IR light source, photoresponse was barely observed, small response was observed with the 532 nm laser illumination, and the highest response was observed for 488 nm laser, as shown in FIG. 9 (panel b). This strong selectivity of photoresponse, indicates that the enhanced response is originated from surface plasmon resonance of Ag nanoparticles upon light, which leads to maximum local optical field around Ag nanoparticles and hence maximum thermal gradient field that drives molecular ions to move when the illumination wavelength is at the closest match with plasmonic resonance frequency.

Figure 10:
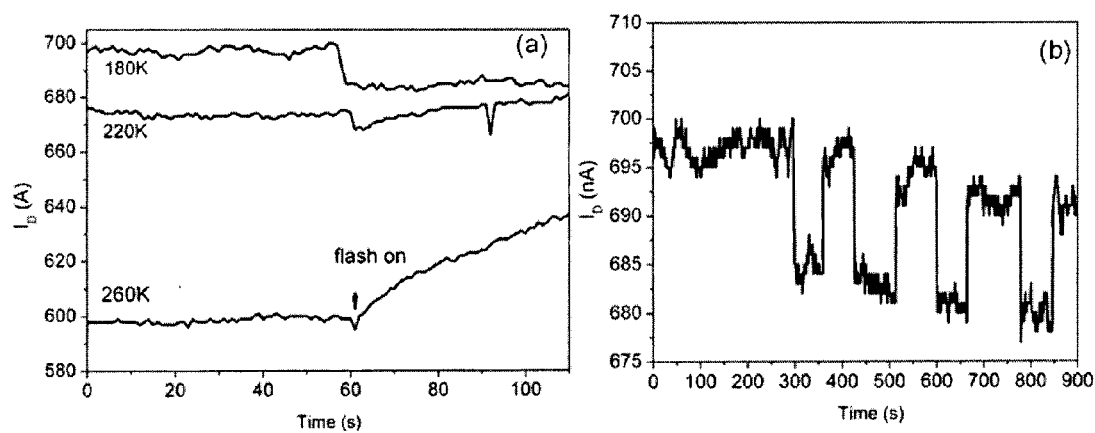
FIG. 10 (panel a) shows the $I_D$-t curves of ionic liquid gated plasmonic graphene measured at zero gate voltage and several different temperatures with light on at 1 minute.

This example has also investigated how the observed photoresponse occurs at a microscopic scale, or how the light induced LSPR evanescent field is transduced to the local redistribution of the ions that are responsible for the electric gate potential. To shed some light on this mechanism, the photoresponse time was measured at different temperatures. FIG. 10 shows a fast photoresponse at low temperatures (180 K) and slow photoresponse with increasing temperatures (260 K). The time dependence of drain current $I_D$ was recorded at zero gate voltage, 5 mV source drain voltage. The white light was turned on at t=60 s. Smaller source and drain voltage was used to decrease the ion motion along source and drain direction. After white light was turned on, there was a significant decrease of $I_D$, approximately 20 nA at 180 K. However, at 260 K, after white light was turned on, there was a significant increase of $I_D$ in 2 minutes, approximately 40 nA, which leads to increased photoconductivity of about 20 S/W compared to the previous result. The quick photoresponse at lower temperature and slow photoresponse time at higher temperature may result from the competition between the ionic molecule deformation and redistribution. At the lower temperature, the former plays a major role when light illumination since the electrolyte is in the solid status. At higher temperature, the motion of molecule ions will dominate, which indicates that the photoresponse is attributed to the movement of accumulated ions at the graphene surface. At zero gate voltage, ions accumulated on the graphene surface upon illumination are due to the similar driven force for the ion movement. Once the light is off, there is no external field or force, except the electrostatic field to drive ions thus they tend to stay on the graphene surface, which probably explains why the $I_D$ stays constant after light is off instead of dropping. Due to Coulomb force between negative and positive ions, $I_D$ current will likely eventually relax to its starting point, which may take long time, over hours or even a day.

Under light, locally enhanced optical field will be generated around Ag nanoparticles due to surface plasmon resonance. There are at least two possibilities to help explain how the local optical field drives the ions to move, including the molecule deformation due direct energy transfer to electrolyte molecules and molecule redistribution driven by temperature gradient around the plasmonic nanoparticles. In the first case, molecules are pumped to excited state upon energy transfer from the plasmonic field, which may lead to direct geometric change of molecules (rotation, folding, etc). In the latter case, the Ohmic heating around plasmonic nanoparticles may generate temperature gradient around the particle. While the former is a fast process, the latter is relatively slow. Therefore, when the electrolyte is in liquid form at temperatures above 180 K, it is highly likely that the ions are driven by the thermal gradient in the vicinity of plasmonic nanostructures and the photoresponse is indeed slow as shown in panel a of FIG. 10. The plasmonic field around Ag nanoparticles is evanescent field and decays with distance exponentially. At 180 K or below, the electrolyte becomes solid and the temperature driven ion motion is prohibited. Interesting, a much faster photoresponse appears, which is attributed to the direct energy transfer to molecules in electrolyte.

All publications and patent applications mentioned in this specification are herein incorporated by reference to the same extent as if each individual publication or patent application was specifically and individually indicated to be incorporated by reference.

Atwater et al., *Plasmonics for improved photovoltaic devices*, Nature Materials 9(3) 205-213 (2010).

Avouris, *Graphene: electronic and photonic properties and devices*, Nano Lett 10(11), 4285-4294 (2010).

Bae et al., *Roll-to-roll production of 30-inch graphene films for transparent electrodes*, Nature Nanotechnology 5(8) 574-578 (2010).

Beck et al., *Plasmonic light-trapping for Si solar cells using self-assembled*, Ag nanoparticles, Progress in Photovoltaics 18(7) 500-504 (2010).

Beck et al., *Tunable light trapping for solar cells using localized surface plasmons*, Journal of Applied Physics 105(11) (2009).

Bonaccorso et al., *Graphene photonics and optoelectronics*, Nature Photonics 4(9) 611-622 (2010).

Bonhote et al., A. P. Dias, N. Papageorgiou et al., Inorg Chem 35(5) 1168 (1996).

Czerw et al., *Substrate-interface interactions between carbon nanotubes and the supporting substrate*, Physical Review B 66(3) (2002).

Das, S. Pisana, B. Chakraborty et al., Nat Nanotechnol 3(4) 210 (2008).

Echtermeyer et al., *Strong plasmonic enhancement of photovoltage in graphene*, Nature Communications 2:458 1-5 (2011).

Ferrari et al., *Raman spectrum of graphene and graphene layers*, Physical Review Letters 97(18) (2006).
Geim and K. S. Novoselov, Nature Materials 6(3) 183 (2007).
Giovannetti, P. A. Khomyakov, G. Brocks et al., Physical Review Letters 101(2) (2008).
Hwang, B. Y. K. Hu, and S. Das Sarma, Phys Rev B 76(11) (2007).
Ishigami et al., *Atomic structure of graphene on SiO2*, Nano Letters 7(6) 1643-1648 (2007).
Kim et al., *Plasmon enhanced performance of organic solar cells using electrodeposited Ag nanoparticles*, Applied Physics Letters 93(7) (2008).
Kim, D. M. Kim, D. H. Woo et al., Appl Phys Lett 72(5) 584 (1998).
Kotz and M. Carlen, Electrochim Acta 45(15-16) 2483 (2000).
Li, W. W. Cai, J. H. An et al., Science 324(5932) 1312 (2009).
Li, Y. W. Zhu, W. W. Cai et al., Nano Lett 9(12) 4359 (2009).
Liu et al., *Doped graphene nanohole arrays for flexible transparent conductors*, Applied Physics Letters 99 (2011).
Liu, R. Cheng, L. Liao et al., Nat Commun 2 (2011).
Luther, P. K. Jain, T. Ewers et al., Nat. Mater. 10(5) 361 (2011).
Mueller, F. N. A. Xia, and P. Avouris, Nat Photonics 4(5) 297 (2010).
Novoselov, A. K. Geim, S. V. Morozov et al., Science 306(5696) 666 (2004).
Pillai et al., *Surface plasmon enhanced silicon solar cells*, Journal of Applied Physics 101(9) (2007).
Sandberg, T. G. Backlund, R. Osterbacka et al., Adv Mater 16(13) 1112 (2004).
Sato, G. Masuda, and K. Takagi, Electrochim Acta 49(21) 3603 (2004).
Sato, T. Morinaga, S. Marukane et al., Adv Mater 23(42) 4868 (2011).
Schwierz F., Nat Nanotechnol 5(7) 487 (2010).
Stankovich et al., *Graphene-based composite materials*, Nature 442(7100) 282-286 (2006).
Stockman, *Nanoplasmonics: The physics behind the applications*, Physics Today 64(2) 39-44 (2011).
Wang et al., *Strong anomalous optical dispersion of graphene: complex refractive index measured by Picometrology*, Optics Express 16(26) 22105-22112 (2008).
Wang, Y. P. Chen, and D. D. Nolte, Opt Express 16(26) 22105 (2008).
Wassei et al., *Graphene, a promising transparent conductor*, Materials Today 13(3) 52-59 (2010).
Xia, D. B. Farmer, Y. M. Lin et al., Nano Lett 10(2) 715 (2010).
Xia, F. Chen, J. H. Li et al., Nat Nanotechnol 4(8) 505 (2009).
Xia, T. Mueller, Y. M. Lin et al., Nat Nanotechnol 4(12) 839 (2009).
Xu et al., *Wavelength tuning of surface plasmon resonance using dielectric layers on silver island films*, Applied Physics Letters 82(22) (2003).
Xu, J. W. Liu, Q. Wang et al., Adv Mater 24(10) Op71 (2012).
Ye, M. F. Craciun, M. Koshino et al., P Natl Acad Sci USA 108(32) 13002 (2011).
Ye, S. Inoue, K. Kobayashi et al., Nat Mater 9(2) 125 (2010).
Yin, Q. L. Deng, X. G. Luo et al., J Appl Phys 104(2) (2008).
Yuan, H. Shimotani, A. Tsukazaki et al., Adv Funct Mater 19(7) 1046 (2009).

From the foregoing it will be seen that this invention is one well adapted to attain all ends and objectives hereinabove set forth, together with the other advantages which are obvious and which are inherent to the invention. Since many possible embodiments may be made of the invention without departing from the scope thereof, it is to be understood that all matters herein set forth or shown in the accompanying drawings are to be interpreted as illustrative, and not in a limiting sense. While specific embodiments have been shown and discussed, various modifications may of course be made, and the invention is not limited to the specific forms or arrangement of parts and steps described herein, except insofar as such limitations are included in the following claims. Further, it will be understood that certain features and subcombinations are of utility and may be employed without reference to other features and subcombinations. This is contemplated by and is within the scope of the claims.

What is claimed and desired to be secured by Letters Patent is as follows:

1. A method for forming plasmonic graphene:
providing a graphene sheet on a support substrate;
forming a film of a plasmonic material on said graphene sheet;
heating at 500° C. or less said graphene sheet with said film of plasmonic material to form plasmonic graphene comprising graphene with plasmonic nanostructures thereon.

2. The method of claim 1 wherein said support substrate comprises a silicon dioxide or glass substrate.

3. The method of claim 1 wherein said providing step comprises the steps of growing a graphene sheet on a copper substrate using chemical vapor deposition; spin-coating a polymethylmethacrylate layer onto said graphene sheet; removing said copper substrate by contacting said copper substrate with an iron chloride solution; transferring said graphene to a silicon dioxide substrate; and removing said polymethylmethacrylate layer.

4. The method of claim 1 wherein said graphene sheet comprises 1 to 3 layers of graphene.

5. The method of claim 1 wherein said plasmonic material is selected from the group consisting of silver, gold, copper, or mixtures thereof.

6. The method of claim 1 wherein said film of plasmonic material has a thickness of about 4 to 10 nm.

7. The method of claim 1 further comprising the step of cleaning said graphene sheet prior to said plasmonic film forming step.

8. The method of claim 1 wherein said heating occurs at about 300° C. or less for about 5 to 60 minutes.

9. The method of claim 1 wherein said plasmonic material comprises silver and said plasmonic graphene comprises silver nanostructures on graphene.

10. The method of claim 9 wherein said nanostructures have an average dimension of about 50 to 150 nm.

11. The method of claim 9 wherein said nanostructures have an average height about 60 nm or less.

12. The method of claim 1 wherein said plasmonic graphene has an electrical conductivity that is higher than a graphene sheet without said plasmonic material.

13. The method of claim 1 wherein said plasmonic graphene exhibits a higher G peak and 2D peak compared to a graphene sheet without said plasmonic material.

14. The method of claim 1 wherein said plasmonic graphene exhibits a red-shifted plasmonic resonance frequency compared to said plasmonic material on bare glass.

15. The method of claim 1 wherein said plasmonic nanostructures are disk-like in shape.

16. The method of claim 1 wherein said plasmonic material is an electrically conductive material.

17. The method of claim 1, wherein said heating occurs for 5 to 60 minutes.

18. The method of claim 1 wherein said heating occurs at 400° C. or less.

19. The method of claim 18 wherein said heating occurs at 300° C. or less.

* * * * *

UNITED STATES PATENT AND TRADEMARK OFFICE
CERTIFICATE OF CORRECTION

PATENT NO. : 9,722,110 B2
APPLICATION NO. : 13/657161
DATED : August 1, 2017
INVENTOR(S) : Judy Wu et al.

Page 1 of 1

It is certified that error appears in the above-identified patent and that said Letters Patent is hereby corrected as shown below:

Column 1,
Lines 15-20, Section "Statement Regarding Federally Sponsored Research or Development", delete the following paragraph:
"The present invention was sponsored by the US Army Research Office No. ARO-W911NF-09-1-0295 and W911NF-12-1-0412, and National Science Foundation Contracts Nos. NSF-DMR-0803149, 1105986, and EPSCoR-0903806, and the government may have certain rights in the invention.";
And insert the following:
--This invention was made with government support under grant numbers W911NF-09-1-0295 and W911NF-12-1-0412 awarded by the Army Research Office, and grant numbers 1105986, 0903806, and 0803149 awarded by the National Science Foundation. The government has certain rights in the invention.--

Signed and Sealed this
Tenth Day of April, 2018

Andrei Iancu
*Director of the United States Patent and Trademark Office*